(12) United States Patent
He et al.

(10) Patent No.: US 9,011,719 B2
(45) Date of Patent: Apr. 21, 2015

(54) WHITE-LIGHT LED RED PHOSPHOR AND METHOD OF MANUFACTURING THE SAME

(75) Inventors: Jinhua He, Nanjing (CN); Xiaoming Teng, Nanjing (CN); Chao Liang, Nanjing (CN); Yibing Fu, Nanjing (CN)

(73) Assignee: Jiangsu Bree Optronics Co., Ltd., Nanjing, Jiangsu (CN)

( * ) Notice: Subject to any disclaimer, the term of this patent is extended or adjusted under 35 U.S.C. 154(b) by 144 days.

(21) Appl. No.: 13/698,997

(22) PCT Filed: Oct. 9, 2010

(86) PCT No.: PCT/CN2010/077624
§ 371 (c)(1),
(2), (4) Date: Feb. 5, 2013

(87) PCT Pub. No.: WO2012/031414
PCT Pub. Date: Mar. 15, 2012

(65) Prior Publication Data
US 2013/0214204 A1    Aug. 22, 2013

(30) Foreign Application Priority Data

Sep. 9, 2010 (CN) .......................... 2010 1 0276384

(51) Int. Cl.
C09K 11/70 (2006.01)
C09K 11/77 (2006.01)
C09K 11/08 (2006.01)
H01L 33/50 (2010.01)
H05B 33/14 (2006.01)

(52) U.S. Cl.
CPC ......... *C09K 11/7786* (2013.01); *C09K 11/0883* (2013.01); *C09K 11/7796* (2013.01); *H01L 33/502* (2013.01); *H05B 33/14* (2013.01); *Y02B 20/181* (2013.01)

(58) Field of Classification Search
USPC ...................................... 252/301.4 P, 301.4 R
See application file for complete search history.

(56) References Cited

U.S. PATENT DOCUMENTS

2009/0272995 A1 * 11/2009 Ito et al. .......................... 257/98

FOREIGN PATENT DOCUMENTS

EP    1568753 A2 *    8/2005

* cited by examiner

*Primary Examiner* — Carol M Koslow
*Assistant Examiner* — Lynne Edmondson

(57) ABSTRACT

A white-light LED red phosphor and method of manufacturing the same are provided. The luminescent materials are represented by the general formula: $Ca_{1-y-m-e-r}Y_yM_mX_{x-p}P_pZ_zN_n:Eu_e, R_f$, wherein M is at least one selected from Sr, Ba, Sc, Li, Na and K; X is at least one selected from B, Al and Ga, and Al must be contained; Z is at least one selected from Si, V and Nb, and Si must be contained; R is at least one selected from Dy, Er, Tm and Lu, and Dy must be contained; $0.001 \leq y \leq 0.2$, $0.001 \leq m \leq 0.2$, $0.5 \leq x \leq 1.5$, $0.5 \leq z \leq 1.5$, $0.001 \leq p \leq 0.1$, $2 \leq n \leq 4$, $0.001 \leq e \leq 0.2$ and $0.001 \leq r \leq 0.1$. The phosphor according to the present invention has features such as good chemical stability, high luminous efficiency, and good anti-luminous attenuation performance, etc.

7 Claims, 15 Drawing Sheets

WHITE-LIGHT LED RED PHOSPHOR AND METHOD OF MANUFACTURING THE SAME

TECHNICAL FIELD

The present invention relates to a red phosphor that can be effectively excited by ultraviolet, violet light or blue light and applied to the white-light LED.

BACKGROUND ART

In recent years, with the gradual improvement of the luminous efficiency of LED and the gradual decrease of cost, semi-conductor lighting gradually becomes the development trend of modern lighting, which is recognized as the fourth generation of lighting source after incandescent lamp, fluorescent lamp, and energy-saving lamp, thus called "green lighting in 21$^{st}$ century."

To apply the semiconductor lighting to the normal lighting field, it is necessary to obtain the high efficient and high color rendering white-light LED. Now, there are several ways to achieve the white-light LED, and the most important way is to apply a yellow phosphor (YAG) on a blue-light LED chip, thereby realizing white-light emission. However, this way has the drawbacks of high coloring temperature and low color rendering index, and thus it cannot satisfy the demands of semi-conductor lighting. Although the emission spectrum of YAG phosphor is very wide, the emission intensity within the red-light area is rather weak, and the phenomenon of red-light deficiency occurs after being mixed with the blue-light LED chip, which therefore affects the relevant color temperature and color rendering index of the white-light LED. Thus, the YAG itself cannot solve the existing problem. However, the above problem can be solved by adding red phosphor.

However, the red phosphor is always one of significant bottlenecks that restrict the technical development of white-light LED. The currently red phosphor has various kinds of problems, for example, CaS:Eu$^{2+}$ having large luminous attenuation and poor chemical stability, CaMoO4:Eu$^{2+}$ having narrow excitation scope, Y$_2$O$_3$:Eu$^{2+}$ and Y$_2$O$_2$S:Eu$^{2+}$ having low luminous efficiency, and M$_2$Si$_5$N$_8$:Eu$^{2+}$ having a poor anti-luminous attenuation performance, none of which can match perfectly with the LED chip.

The U.S. Pat. No. 7,252,788 discloses a nitride phosphor comprising MmAaBbNn:Zz, where M is a divalent element selected from at least one of Be, Mg, Ca, Sr, Ba, Zn, Cd and Hg; A is a trivalent element selected from at least one of B, Al, Ga, In, Tl, Y, Sc, P, As, Sb and Bi; B is a quadrivalent element selected from at least one of C, Si, Ge, Sn, Ti, Hf, Mo, W, Cr, Pb and Zr; and Z is an activator selected from at least one of rare earth element or transition element; (m+z):a:b:n=1:1:1:3, 0.0001≤z/(m+z)≤0.5. The phosphor may be effectively excited between 300-550 nm, and the position of emission peak varies with the content of Eu$^{2+}$. The manufacturing method uses one-step synthesis method. The synthesis temperature is 1200-1700° C.; the pressure is about 0.5 Mpa. The family of this patent comprises: JP2005239985, EP1568753, and CN1683470A.

The U.S. Pat. No. 7,273,568 discloses a phosphor with the formula of MmAaBbOoNn:Zz, where M is a divalent element selected from at least one of Mg, Ca, Sr, Ba and Zn; A is a trivalent element selected from at least one of B, Al and Ga; B is a quadrivalent element selected from Si or Ge; and Z is an activator selected from at least one of rare earth element or transition element. The manufacturing method also uses one-step synthesis method. The pressure is 0.001 MPa≤P≤0.1 Mpa. Similar patents include U.S. Pat. No. 7,476,337, U.S. Pat. No. 7,476,338, and EP1630219, etc.

The US patent US2010096592 discloses a phosphor comprising M-Al—Si—N, where M is Ca, Sr, and Ba, and adds LiF as flux.

The manufacture method of all the existing patents uses the high-temperature and high-pressure one-step synthesis method. However, the resulting phosphor has relatively low luminous intensity. Furthermore, this manufacturing method is quite demanding on the devices. Therefore, they have problems such as high cost and complex process.

SUMMARY OF THE INVENTION

An objective of the present invention is to address the problems of nitride red phosphor in aspects of luminous efficiency and manufacturing method, thereby providing a new efficient LED red phosphor. This phosphor has good chemical stability, high luminous efficiency, and good anti-luminous attenuation performance, etc., and thus it may well satisfy the packaging application requirements of the white-light LED.

Another objective of the present invention is to provide a method of manufacturing the phosphor. This manufacturing method is easy to operate, pollution-free, and low cost.

The chemical structural formula of the white-light LED red phosphor according to the present invention is:

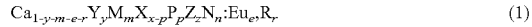

$$Ca_{1-y-m-e-r}Y_yM_mX_{x-p}P_pZ_zN_n:Eu_e,R_r \qquad (1)$$

Wherein, M is at lease one of Sr, Ba, Sc, Li, Na and K;
X is at least one of B, Al and Ga, wherein Al is must;
Z is at least one of Si, V and Nb, wherein Si is must;
R is at least one of Dy, Er, Tm and Lu, wherein Dy is must.
0.001≤y≤0.2, 0.001≤m≤0.2, 0.5≤x≤1.5, 0.5≤z≤1.5, 0.001≤p≤0.1, 2≤n≤4, 0.001≤e≤0.2, 0.001≤r≤0.1

The method of manufacturing the white-light LED red phosphor comprises steps of:
1) weighing the required raw materials from nitrides of Ca, Sr, Ba, Li, Na and K, and nitrides or oxides of Y, Sc, B, Al, Ga, P, Si, V, Nb, Eu, Dy, Er, Tm and Lu according to the chemical formula components in the structural formula (1) and stoichiometric ratio.
2) sufficiently mixing these raw materials in argon, nitrogen or nitrogen-argon mixing atmosphere;
3) performing segmented roasting to these mixed raw materials in the tubular furnace with the protective atmosphere adopting the normal-pressure high-temperature solid-state method; and
4) then going through post-processing, thereby making the required red phosphor;

In the above step 1), the Eu dosage is 0.1%-20% of the synthetic material mol, and the dosage of R is 0.1%-10% of the synthetic material mol.

In the above step 2), because some materials are rather sensitive to the air and water, the contents of O$_2$ and H$_2$O in the nitrogen, argon, or nitrogen-argon mixing atmosphere should be controlled between 0.1-50 ppm;

In the above step 3), the protective atmosphere may be pure nitrogen atmosphere, or nitride-hydrogen mixing atmosphere, or pure hydrogen atmosphere, and the atmosphere pressure is normal pressure.

Segmented roasting process is adopted in step 3), the roasting temperature of the first segment is 700-1200° C., with the roasting time being 2-6 h; the roasting temperature of the second segment is 1400-1800° C., with the roasting time being 6-18 h;

In the above step 4), the post-processing procedures comprise: grinding, sifting, washing, drying, etc., where sifting is performed after grinding, washing is performed till the conductivity being less than 20 μs/cm, and finally drying is performed to obtain a finished product.

The present invention optimizes and adjusts the crystal field of phosphor by using plural combinations of elements such as alkali metal, P and Y. The manufacturing method that adopts segmented roasting and normal-pressure high-temperature sintering may not only adjust the position of emission peak, but also greatly improve the luminous intensity of phosphor, such that its chemical stability, luminous efficiency and anti-luminous attenuation performance can well satisfy the needs of LED. The specific advantages are specified below:

1. High luminous efficiency. The present invention uses alkali metal as a charge compensation agent, which may reduce generation of oxygen vacancy deficiency during the sintering process, thereby reducing the probability of non-radiative transition, such that it may not only adjust the position of emission peak of phosphor, but also enhance the luminous intensity; Y that substitutes alkali metal makes the $Eu^{2+}$ 5 d orbital splitting become smaller, which causes decrease of probability of non-radiative transition, thereby enhancing the luminous performance of phosphor; introduction of P generates additional impurity level in the forbidden band, thereby effectively reducing the gap between the conduction band and valence band, so as to significantly improve the luminous intensity of the phosphor; segmented roasting enables the raw materials to be better mixed in the melting state, which also plays a role of oxygen removal; further high-temperature roasting facilitates sufficient reaction to obtain a pure single phase, thereby enhancing the luminous intensity of the phosphor.
2. Good anti-luminous attenuation performance. Because the ion radius of elements such Y, Dy is smaller than that of Ca in the host, the adhesion strength between ions is much stronger, which results in a better anti-luminous attenuation performance of phosphor.
3. The present invention employs a typical tube furnace with normal-pressure atmosphere protection. During the synthesizing process, it needs no provision of high-pressure gas (0.1-10 MPa) for protection, thereby lowering the demands on equipments and energy consumption. The process is also simplified, so is the process control. Further, no pollution is generated.

DETAILED EMBODIMENTS

Embodiment 1

Figure 1:
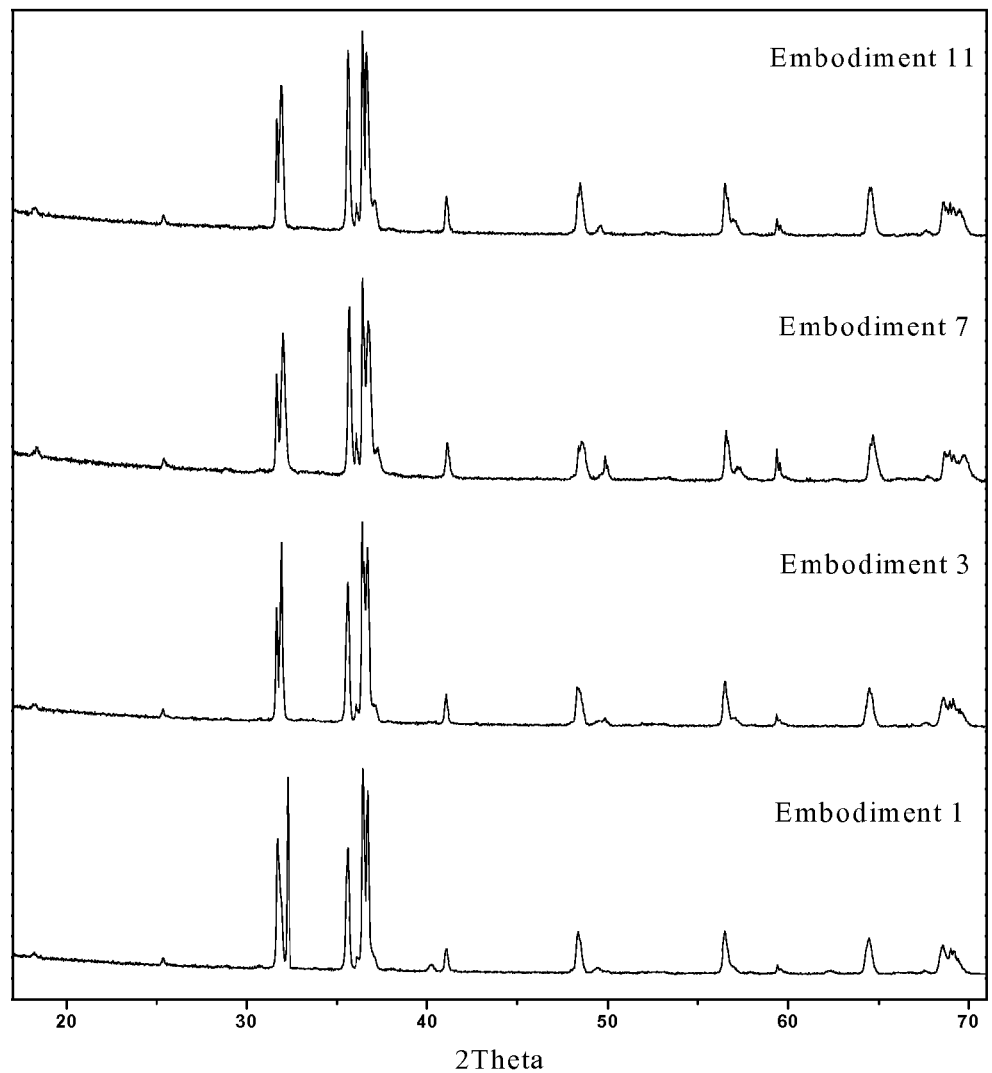
FIG. 1 The XRD pattern of Embodiments 1, 3, 7 and 11.
Figure 2:
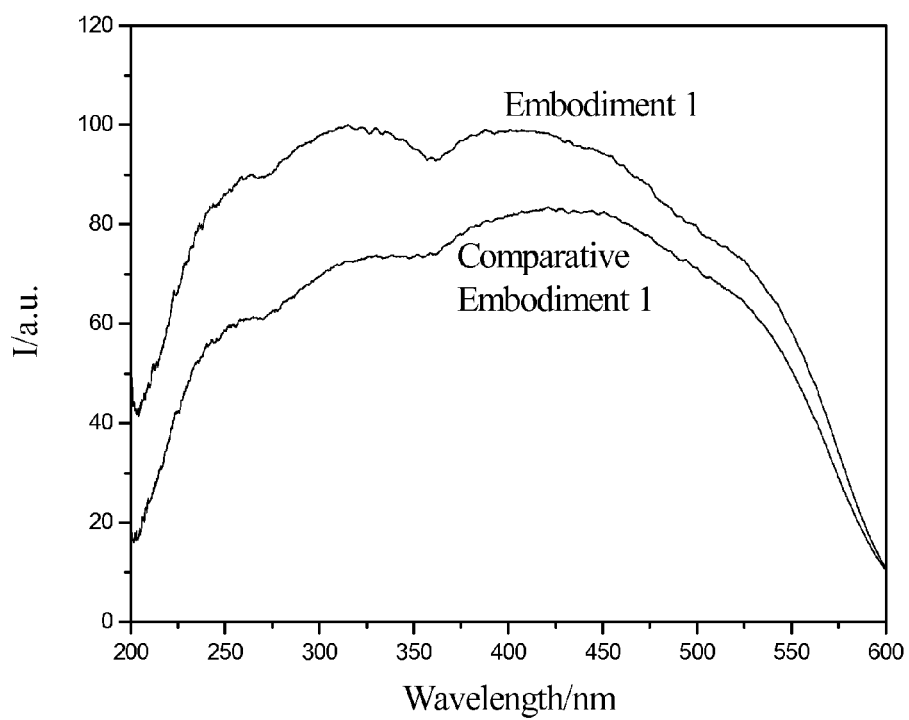
FIG. 2 The excitation spectrum comparison between Embodiment 1 and Comparative Embodiment 1.
Figure 3:
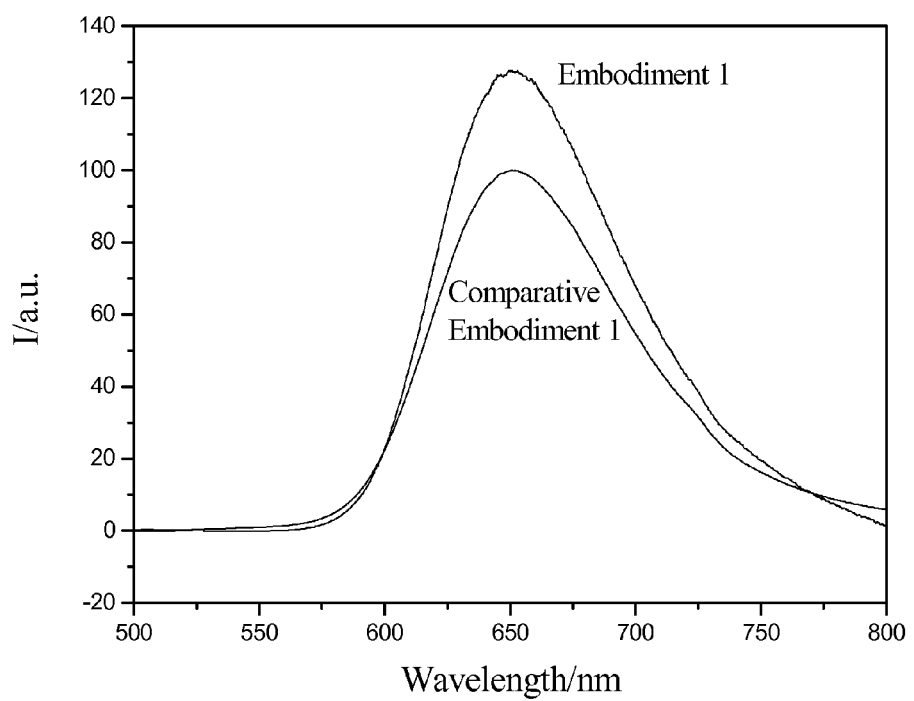
FIG. 3 The emission spectrum comparison between Embodiment 1 and Comparative Embodiment 1.
Figure 4:
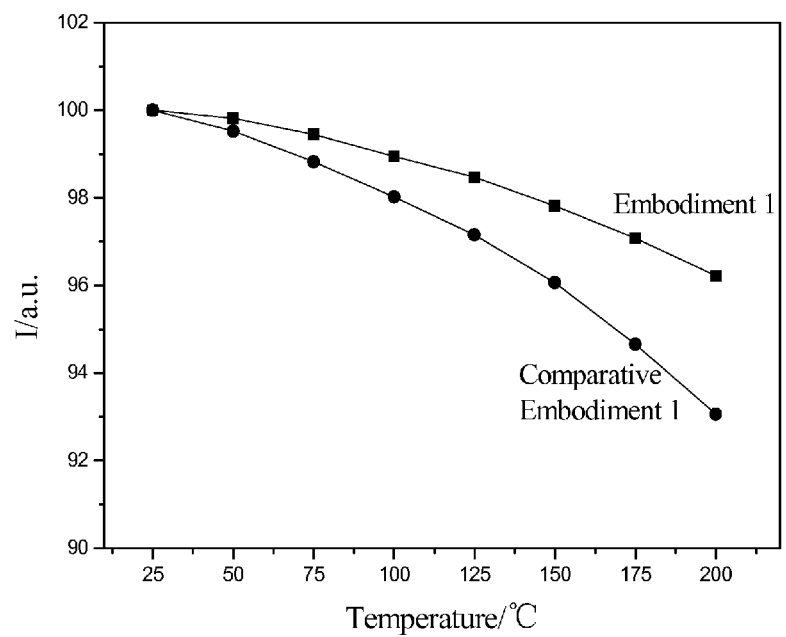
FIG. 4 The temperature quenching performance comparison between Embodiment 1 and Comparative Embodiment 1.
Figure 5:
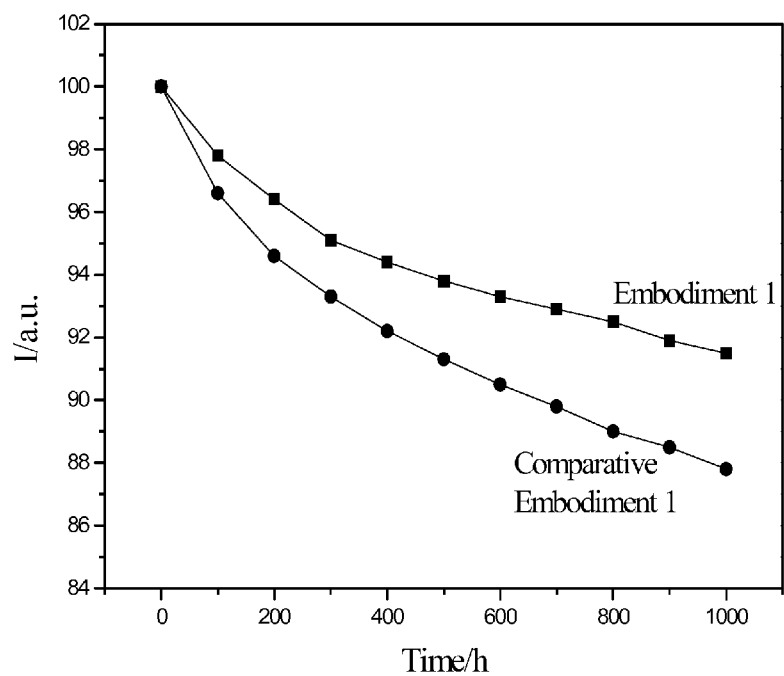
FIG. 5 The anti-luminous attenuation performance comparison between Embodiment 1 and Comparative Embodiment 1.
Figure 6:
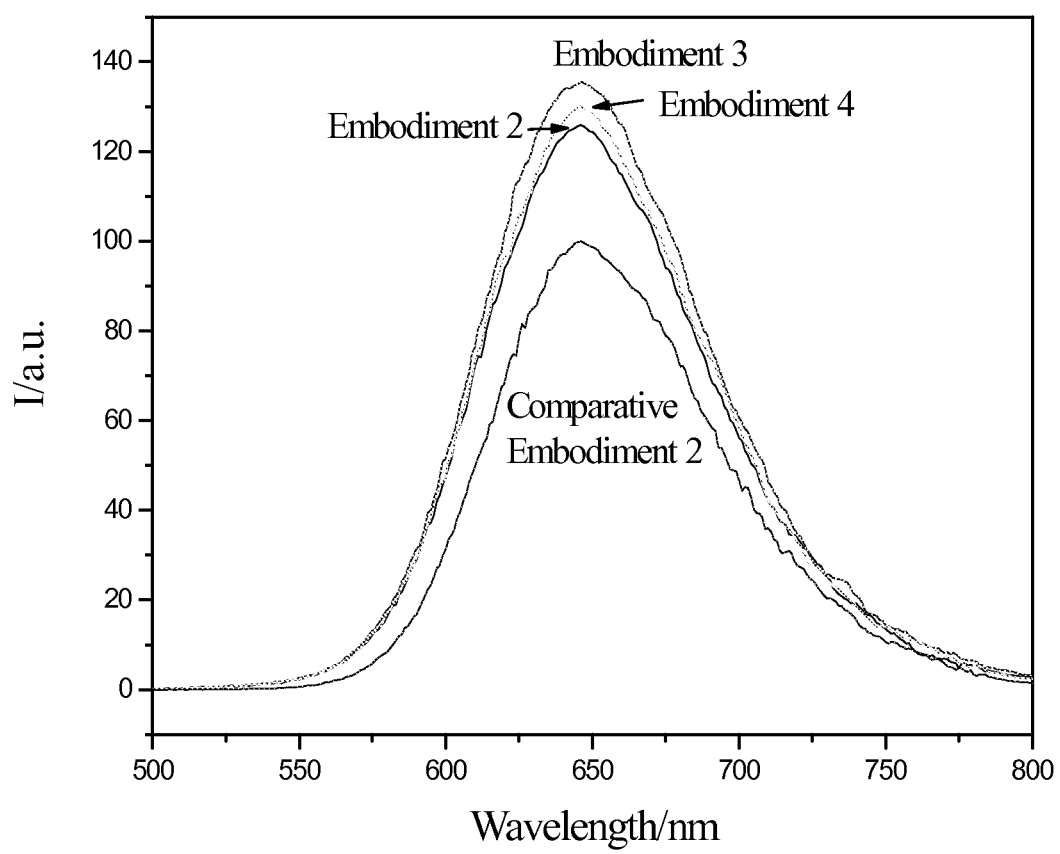
FIG. 6 The emission spectrum comparison between Embodiments 2-4 and Comparative Embodiment 2.
Figure 7:
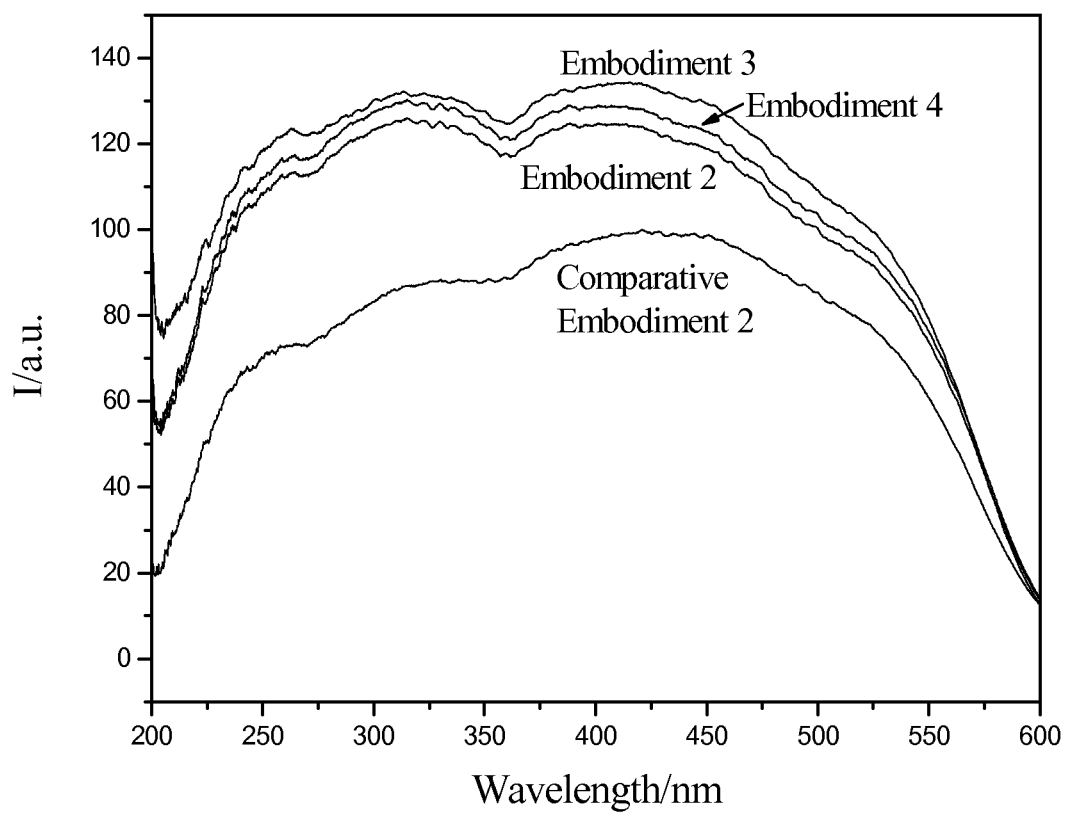
FIG. 7 The excitation spectrum comparison between Embodiments 2-4 and Comparative Embodiment 2.
Figure 8:
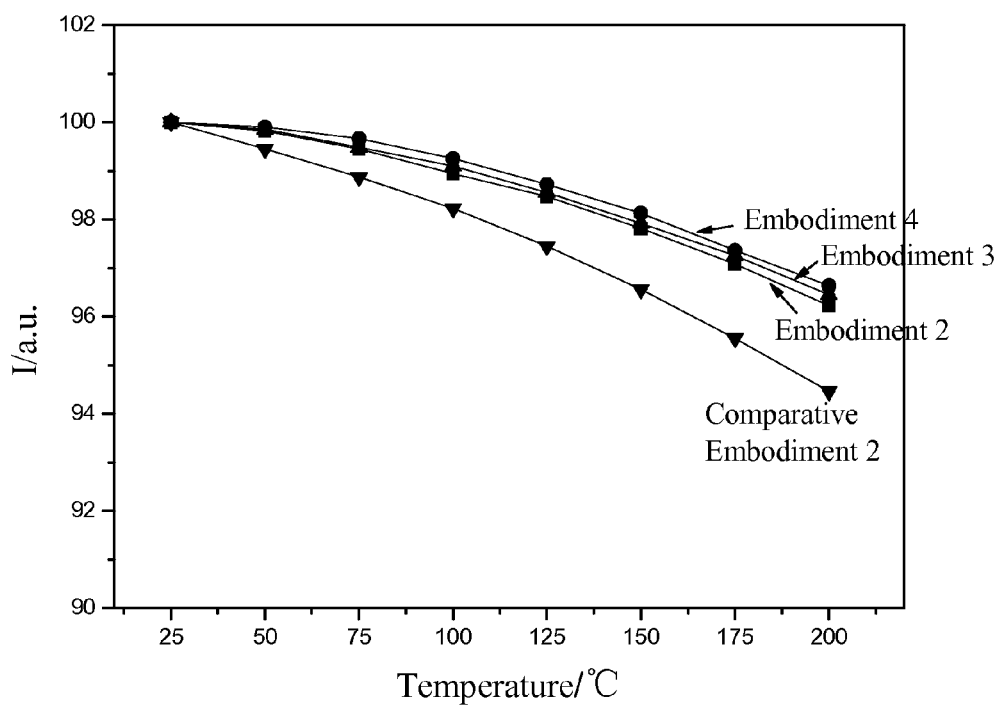
FIG. 8 The temperature quenching performance comparison between Embodiments 2-4 and Comparative Embodiment 2.
Figure 9:
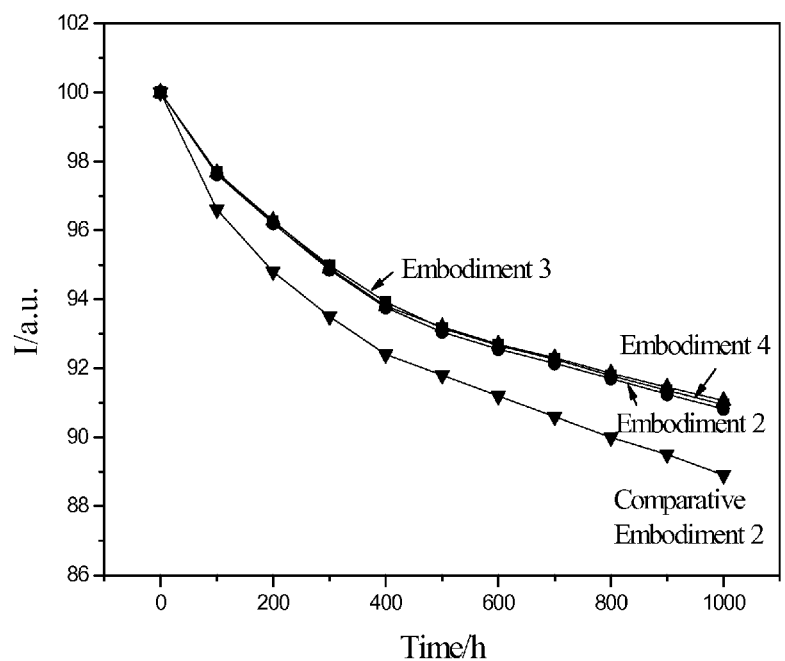
FIG. 9 The anti-luminous attenuation performance comparison between Embodiments 2-4 and Comparative Embodiment 2.
Figure 10:
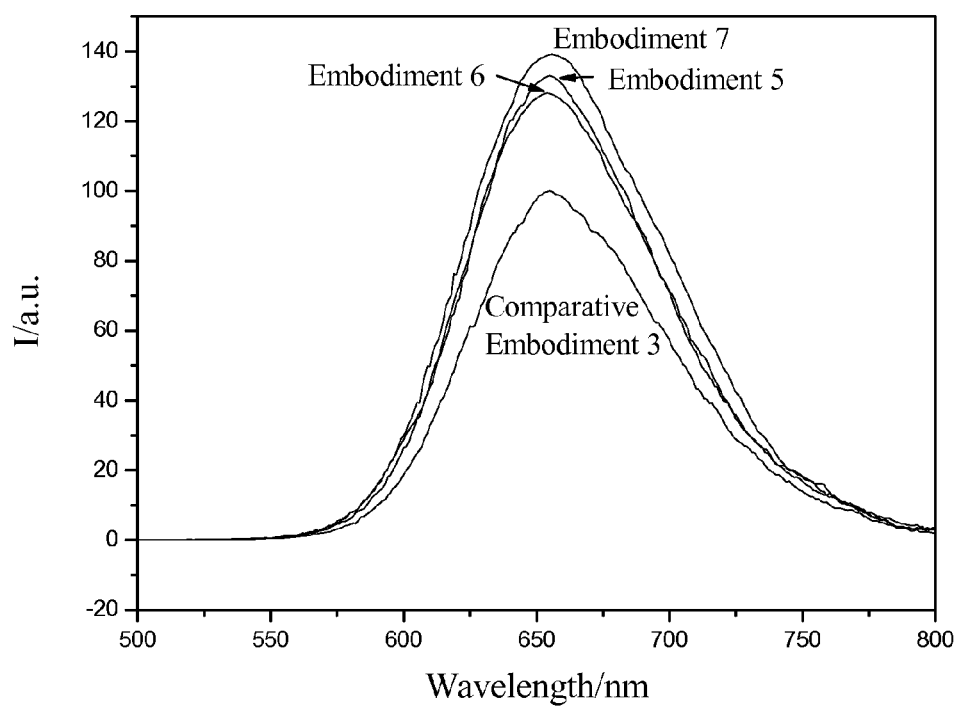
FIG. 10 The emission spectrum comparison between Embodiments 5-7 and Comparative Embodiment 3.
Figure 11:
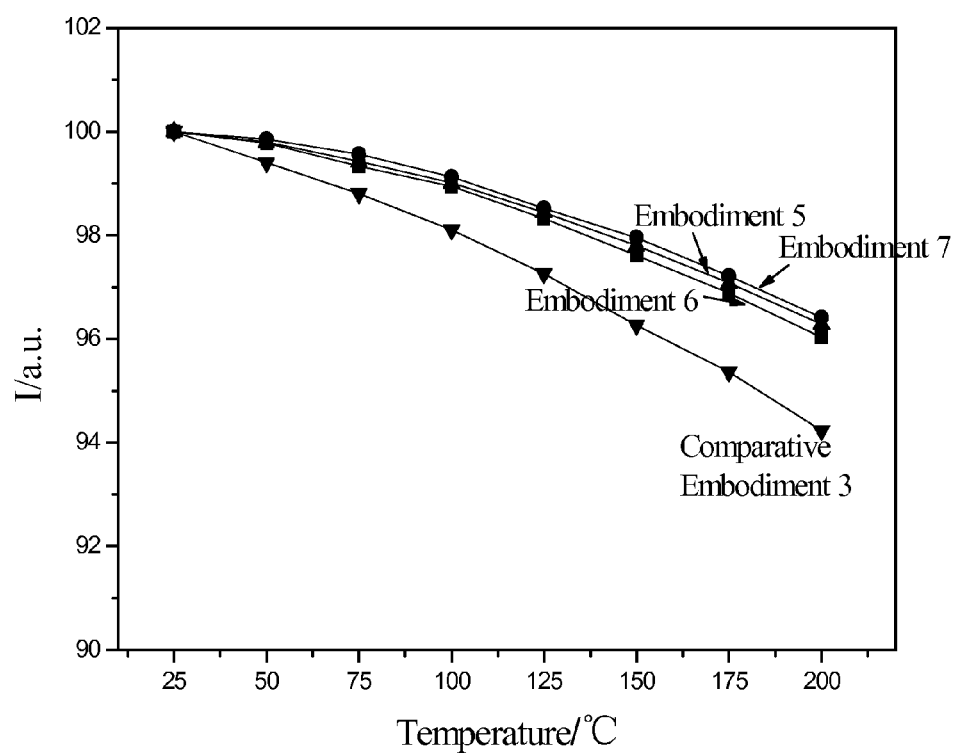
FIG. 11 The temperature quenching performance comparison between Embodiments 5-7 and Comparative Embodiment 3.
Figure 12:
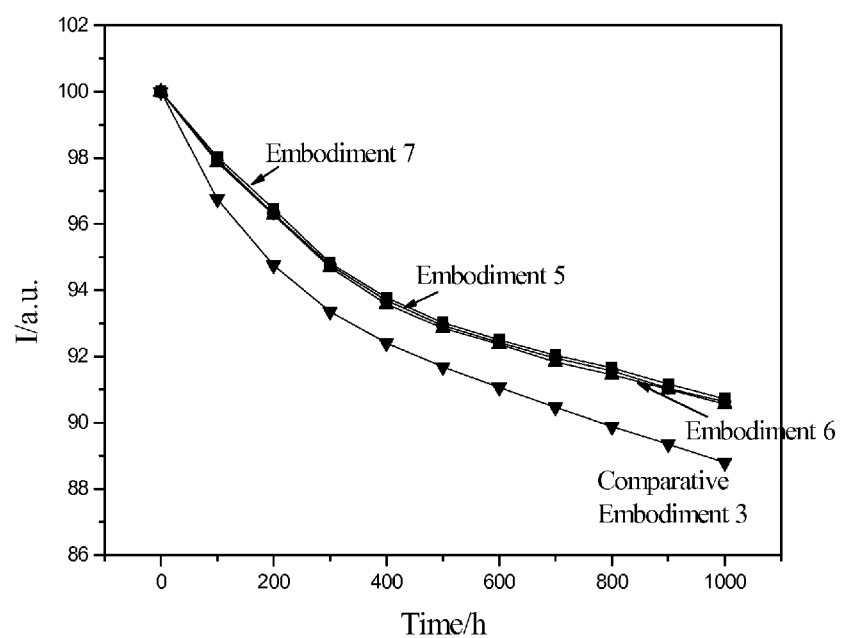
FIG. 12 The anti-luminous attenuation performance comparison between Embodiments 5-7 and Comparative Embodiment 3.
Figure 13:
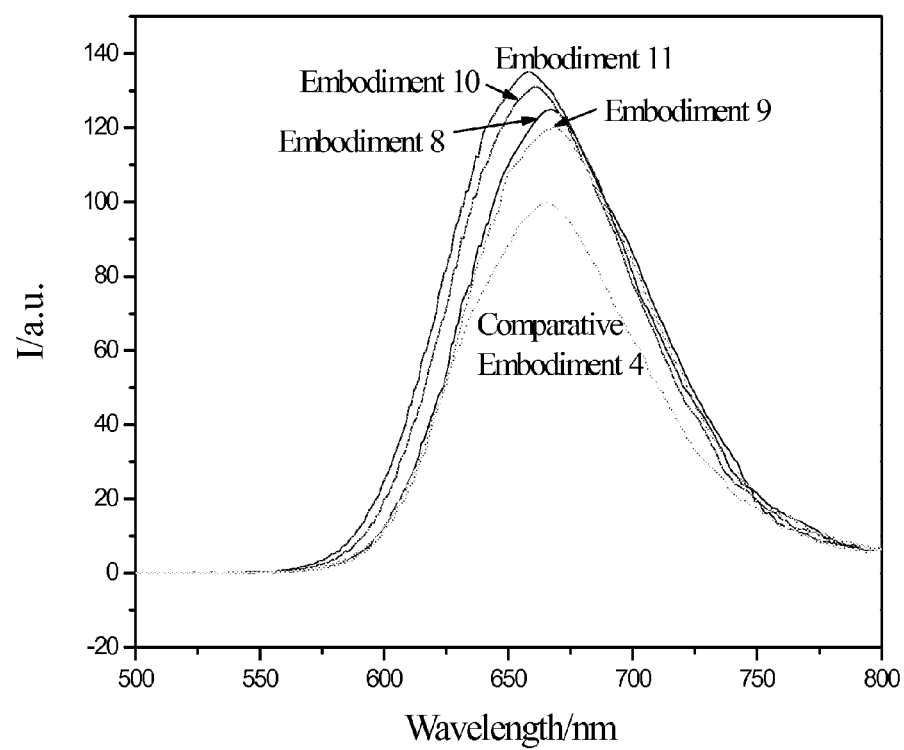
FIG. 13 The emission spectrum comparison between Embodiments 8-11 and Comparative Embodiment 4.
Figure 14:
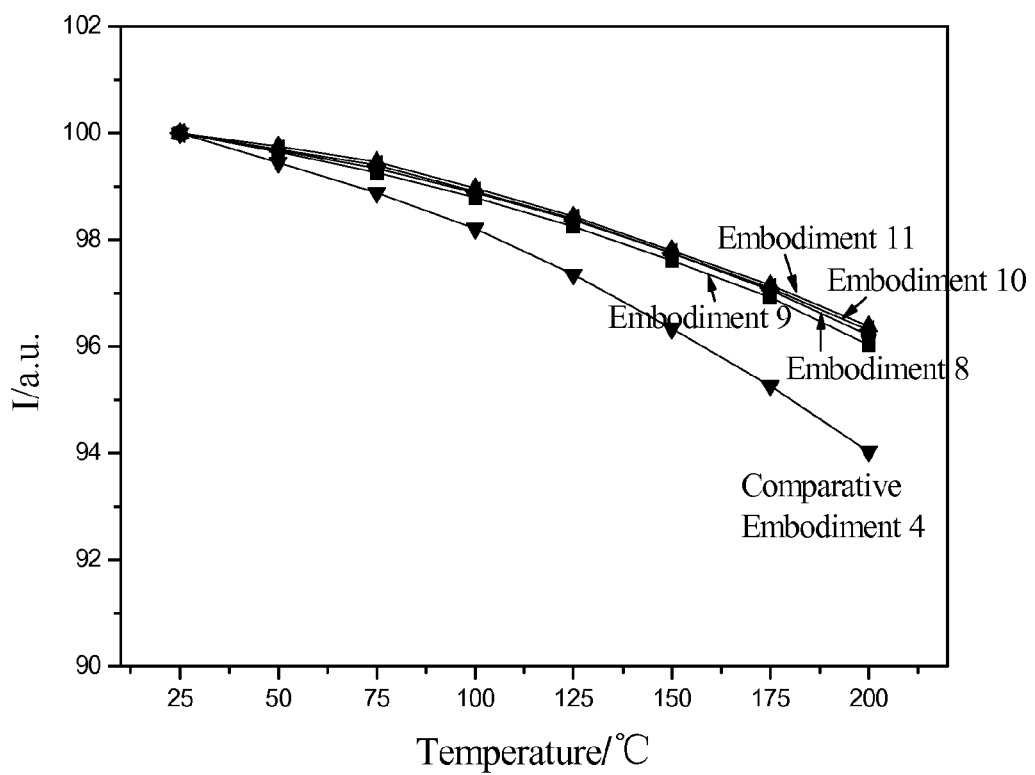
FIG. 14 The temperature quenching performance comparison between Embodiments 8-11 and Comparative Embodiment 4.
Figure 15:
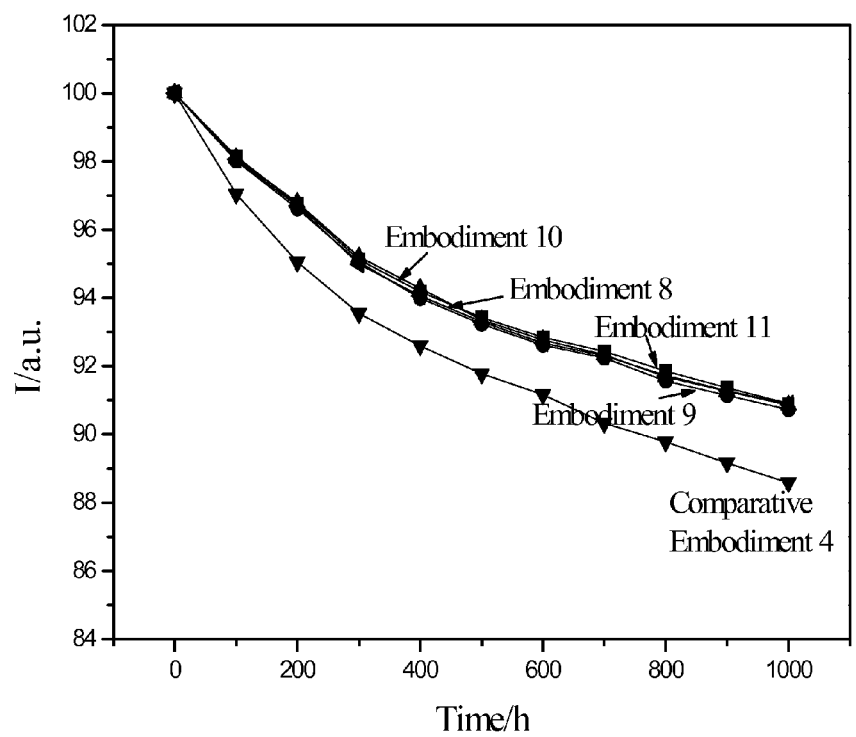
FIG. 15 The anti-luminous attenuation performance comparison between Embodiments 8-11 and Comparative Embodiment 4.

Weighing $Ca_3N_2$ 6.048 g, $Y_2O_3$ 0.304 g, $Si_3N_4$ 6.289 g, AlN 5.292 g, $P_2O_5$ 0.382 g, $Eu_2O_3$ 1.183 g, $Dy_2O_3$ 0.502 g, sufficiently mixing these raw materials in the protective atmosphere, placing them into the molybdenum crucible, and rapidly migrating them into the tubular furnace, and then increasing temperature gradually to 800° C. under the protection of highly pure nitrogen gas, maintaining the temperature for 5 h, and then raising the temperature till 1450° C., maintaining the temperature for 10 h, sifting after grinding, and washing till the conductivity being 8.85 μs/cm, and finally drying under the temperature of 90° C., thereby obtaining the phosphor of $Ca_{0.91}Y_{0.02}Al_{0.96}P_{0.04}SiN_3:0.05Eu$, 0.02Dy. Its luminous intensity is specified in Table 1, which is higher than the Comparative Embodiment 1.

Comparative Embodiment 1

Weighing $Ca_3N_2$ 6.544 g, $Si_3N_4$ 6.517 g, AlN 5.713 g, $Eu_2O_3$ 1.226 g, sufficiently mixing these raw materials in the protective atmosphere, placing them into the molybdenum crucible, and rapidly migrating them into the tubular furnace, and then increasing temperature to 1450° C. under the protection of highly pure nitrogen gas, maintaining the temperature for 10 h, with an atmosphere pressure being 5 MPa, sifting after grinding, and washing till the conductivity being 8.85 μs/cm, and finally drying under the temperature of 90° C., thereby obtaining the phosphor of $Ca_{0.95}ASiN_3:0.05Eu$.

TABLE 1

| | Chemical formula | Emission peak | x | y | Luminous intensity |
|---|---|---|---|---|---|
| Embodiment 1 | $Ca_{0.91}Y_{0.02}Al_{0.96}P_{0.04}SiN_3:0.05Eu$, 0.02Dy | 651 | 0.6644 | 0.3345 | 127 |

TABLE 1-continued

| | Chemical formula | Emission peak | x | y | Luminous intensity |
|---|---|---|---|---|---|
| Comparative Embodiment 1 | $Ca_{0.95}AlSiN_3:0.05Eu$ | 650 | 0.6640 | 0.3451 | 100 |

Embodiment 2

Weighing $Ca_3N_2$ 6.259 g, $Y_2O_3$ 0.466 g, $Si_3N_4$ 6.436 g, AlN 5.247 g, BN 0.171 g, $P_2O_5$ 0.195 g, $Eu_2O_3$ 0.969 g, $Dy_2O_3$ 0.257 g, sufficiently mixing these raw materials in the protective atmosphere, placing them into the molybdenum crucible, and rapidly migrating them into the tubular furnace, and then increasing temperature gradually to 900° C. under the protection of nitrogen-hydrogen mixing gas, maintaining the temperature for 4 h, and then raising the temperature till 1650° C., maintaining the temperature for 9 h, sifting after grinding, and washing till the conductivity being 12.64 μs/cm, and finally drying under the temperature of 100° C., thereby obtaining the phosphor of $Ca_{0.92}Y_{0.03}Al_{0.93}B_{0.05}P_{0.02}SiN_3:0.04Eu, 0.01Dy$. Its luminous intensity is specified in Table 2, which is higher than the Comparative Embodiment 2.

Embodiment 3

Weighing $Ca_3N_2$ 6.134 g, $Y_2O_3$ 0.457 g, $Si_3N_4$ 6.308 g, AlN 5.143 g, GaN 0.565 g, $P_2O_5$ 0.192 g, $Eu_2O_3$ 0.949 g, $Dy_2O_3$ 0.252 g, sufficiently mixing these raw materials in the protective atmosphere, placing them into the molybdenum crucible, and rapidly migrating them into the tubular furnace, and then increasing temperature gradually to 900° C. under the protection of nitrogen-hydrogen mixing gas, maintaining the temperature for 4 h, and then raising the temperature till 1650° C., maintaining the temperature for 9 h, sifting after grinding, and washing till the conductivity being 12.64 μs/cm, and finally drying under the temperature of 100° C., thereby obtaining the phosphor of $Ca_{0.92}Y_{0.03}Al_{0.93}B_{0.05}P_{0.02}SiN_3:0.04Eu, 0.01Dy$. Its luminous intensity is specified in Table 2, which is higher than the Comparative Embodiment 2.

Embodiment 4

Weighing $Ca_3N_2$ 6.149 g, $Y_2O_3$ 0.458 g, $Si_3N_4$ 6.071 g, $V_2O_5$ 0.492 g, AlN 5.433 g, $P_2O_5$ 0.192 g, $Eu_2O_3$ 0.952 g, $Dy_2O_3$ 0.252 g, sufficiently mixing these raw materials in the protective atmosphere, placing them into the molybdenum crucible, and rapidly migrating them into the tubular furnace, and then increasing temperature gradually to 900° C. under the protection of nitrogen-hydrogen mixing gas, maintaining the temperature for 4 h, and then raising the temperature till 1650° C., maintaining the temperature for 9 h, sifting after grinding, and washing till the conductivity being 12.64 μs/cm, and finally drying under the temperature of 100° C., thereby obtaining the phosphor of $Ca_{0.92}Y_{0.03}Al_{0.98}P_{0.02}Si_{0.96}V_{0.04}N_3:0.04Eu, 0.01Dy$. Its luminous intensity is specified in Table 2, which is higher than the Comparative Embodiment 2.

Comparative Embodiment 2

Weighing $Ca_3N_2$ 6.671 g, $Si_3N_4$ 6.575 g, AlN 5.764 g, $Eu_2O_3$ 0.989 g, sufficiently mixing these raw materials in the protective atmosphere, placing them into the molybdenum crucible, and rapidly migrating them into the tubular furnace, and then increasing temperature gradually to 900° C. under the protection of nitrogen-hydrogen mixing gas, maintaining the temperature for 4 h, and then raising the temperature till 1650° C., maintaining the temperature for 9 h, sifting after grinding, and washing till the conductivity being 12.64 μs/cm, and finally drying under the temperature of 100° C., thereby obtaining the phosphor of $Ca_{0.96}AlSiN_3:0.04Eu$. Its luminous intensity is specified in Table 2, which is lower than each Embodiment.

TABLE 2

| | Chemical formula | Emission peak | x | y | Luminous intensity |
|---|---|---|---|---|---|
| Embodiment 2 | $Ca_{0.92}Y_{0.03}Al_{0.93}B_{0.05}P_{0.02}SiN_3:0.04Eu, 0.01Dy$ | 646 | 0.6532 | 0.3456 | 126 |
| Embodiment 3 | $Ca_{0.92}Y_{0.03}Al_{0.93}Ga_{0.05}P_{0.02}SiN_3:0.04E, 0.01Dy$ | 645 | 0.6529 | 0.3459 | 135 |
| Embodiment 4 | $Ca_{0.92}Y_{0.03}Al_{0.98}P_{0.02}Si_{0.96}V_{0.04}N_3:0.04Eu, 0.01Dy$ | 646 | 0.6534 | 0.3452 | 130 |
| Comparative Embodiment 2 | $Ca_{0.96}AlSiN_3:0.04Eu$ | 645 | 0.6527 | 0.3462 | 100 |

Embodiment 5

Weighing $Ca_3N_2$ 5.419 g, $Y_2O_3$ 0.583 g, $Si_3N_4$ 6.033 g, AlN 5.131 g, $P_2O_5$ 0.275 g, $Eu_2O_3$ 1.589 g, $Dy_2O_3$ 0.722 g, $Tm_2O_3$ 0.249 g, sufficiently mixing these raw materials in the protective atmosphere, placing them into the molybdenum crucible, and rapidly migrating them into the tubular furnace, and then increasing temperature gradually to 850° C. under the protection of highly pure hydrogen gas, maintaining the temperature for 3 h, and then raising the temperature till 1700° C., maintaining the temperature for 12 h, sifting after grinding, and washing till the conductivity being 9.12 μs/cm, and finally drying under the temperature of 90° C., thereby obtaining the phosphor of $Ca_{0.85}Y_{0.04}Al_{0.97}P_{0.03}SiN_{2.87}:0.07Eu, 0.03Dy, 0.01Tm$. Its luminous intensity is specified in Table 3, which is higher than the Comparative Embodiment 3.

Embodiment 6

Weighing $Ca_3N_2$ 5.308 g, $Y_2O_3$ 0.577 g, $Si_3N_4$ 5.979 g, AlN 5.084 g, $P_2O_5$ 0.272 g, $Eu_2O_3$ 1.575 g, $Dy_2O_3$ 0.715 g, $Er_2O_3$ 0.489 g, sufficiently mixing these raw materials in the protective atmosphere, placing them into the molybdenum crucible, and rapidly migrating them into the tubular furnace, and then increasing temperature gradually to 850° C. under the protection of highly pure hydrogen gas, maintaining the temperature for 3 h, and then raising the temperature till 1700° C., maintaining the temperature for 12 h, sifting after grinding, and washing till the conductivity being 9.12 μs/cm, and finally drying under the temperature of 90° C., thereby obtaining the phosphor of $Ca_{0.84}Y_{0.04}Al_{0.97}P_{0.03}SiN_{2.86}$: 0.07Eu,0.03Dy,0.02Er. Its luminous intensity is specified in Table 3, which is higher than the Comparative Embodiment 3.

Embodiment 7

Weighing $Ca_3N_2$ 5.305 g, $Y_2O_3$ 0.577 g, $Si_3N_4$ 5.975 g, AlN 5.081 g, $P_2O_5$ 0.272 g, $Eu_2O_3$ 1.574 g, $Dy_2O_3$ 0.715 g, $Tm_2O_3$ 0.247 g, $Lu_2O_3$ 0.254 g, sufficiently mixing these raw materials in the protective atmosphere, placing them into the molybdenum crucible, and rapidly migrating them into the tubular furnace, and then increasing temperature gradually to 850° C. under the protection of highly pure hydrogen gas, maintaining the temperature for 3 h, and then raising the temperature till 1700° C., maintaining the temperature for 12 h, sifting after grinding, and washing till the conductivity being 9.12 μs/cm, and finally drying under the temperature of 90° C., thereby obtaining the phosphor of $Ca_{0.84}Y_{0.04}Al_{0.97}P_{0.03}SiN_{2.86}$:0.07Eu,0.03Dy,0.01Tm, 0.01Lu. Its luminous intensity is specified in Table 3, which is higher than the Comparative Embodiment 3.

Comparative Embodiment 3

Weighing $Ca_3N_2$ 6.295 g, $Si_3N_4$ 6.404 g, AlN 5.614 g, $Eu_2O_3$ 1.687 g, sufficiently mixing these raw materials in the protective atmosphere, placing them into the molybdenum crucible, and rapidly migrating them into the tubular furnace, and then increasing temperature gradually to 850° C. under the protection of highly pure hydrogen gas, maintaining the temperature for 3 h, and then raising the temperature till 1700° C., maintaining the temperature for 12 h, sifting after grinding, and washing till the conductivity being 9.12 μs/cm, and finally drying under the temperature of 90° C., thereby obtaining the phosphor of $Ca_{0.93}AlSiN_{2.95}$:0.07Eu. Its luminous intensity is specified in Table 3, which is lower than each embodiment.

Embodiment 8

Weighing $Ca_3N_2$ 5.377 g, $Y_2O_3$ 0.296 g, $Na_3N$ 0.109 g, $Si_3N_4$ 6.129 g, AlN 5.265 g, $P_2O_5$ 0.186 g, EuN 2.175 g, DyN 0.463 g, sufficiently mixing these raw materials in the protective atmosphere, pouring them into the molybdenum crucible, and rapidly migrating them into the tubular furnace, and then increasing temperature gradually to 1200° C. under the protection of highly pure nitrogen gas, maintaining the temperature for 3 h, and then raising the temperature till 1550° C., maintaining the temperature for 10 h, sifting after grinding, and washing till the conductivity being 4.68 μs/cm, and finally drying under the temperature of 110° C., thereby obtaining the phosphor of $Ca_{0.83}Na_{0.03}Y_{0.02}Al_{0.98}P_{0.02}SiN_3$: 0.1Eu,0.02Dy. Its luminous intensity is specified in Table 4, which is higher than the Comparative Embodiment 4.

Embodiment 9

Weighing $Ca_3N_2$ 5.394 g, $Y_2O_3$ 0.297 g, $Na_3N$ 0.046 g, $Si_3N_4$ 6.148 g, AlN 5.282 g, $P_2O_5$ 0.187 g, EuN 2.182 g, DyN 0.464 g, sufficiently mixing these raw materials in the protective atmosphere, pouring them into the molybdenum crucible, and rapidly migrating them into the tubular furnace, and then increasing temperature gradually to 1200° C. under the protection of highly pure nitrogen gas, maintaining the temperature for 3 h, and then raising the temperature till 1550° C., maintaining the temperature for 10 h, sifting after grinding, and washing till the conductivity being 4.68 μs/cm, and finally drying under the temperature of 110° C., thereby obtaining the phosphor of $Ca_{0.83}Li_{0.03}Y_{0.02}Al_{0.98}P_{0.02}SiN_3$: 0.1Eu, 0.02Dy. Its luminous intensity is specified in Table 4, which is higher than the Comparative Embodiment 4.

Embodiment 10

Weighing $Ca_3N_2$ 5.066 g, $Y_2O_3$ 0.289 g, $Sr_3N_2$ 0.745 g, $Si_3N_4$ 5.991 g, AlN 5.147 g, $P_2O_5$ 0.182 g, EuN 2.127 g, DyN 0.452 g, sufficiently mixing these raw materials in the protective atmosphere, pouring them into the molybdenum crucible, and rapidly migrating them into the tubular furnace, and then increasing temperature gradually to 1200° C. under the protection of highly pure nitrogen gas, maintaining the temperature for 3 h, and then raising the temperature till 1550° C., maintaining the temperature for 10 h, sifting after grinding, and washing till the conductivity being 4.68 μs/cm, and finally drying under the temperature of 110° C., thereby obtaining the phosphor of $Ca_{0.8}Sr_{0.06}Y_{0.02}Al_{0.98}P_{0.02}SiN_3$: 0.1Eu,0.02Dy. Its luminous intensity is specified in Table 4, which is higher than the Comparative Embodiment 4.

Embodiment 11

Weighing $Ca_3N_2$ 4.979 g, $Y_2O_3$ 0.284 g, $Ba_3N_2$ 1.073 g, $Si_3N_4$ 5.889 g, AlN 5.059 g, $P_2O_5$ 0.179 g, EuN 2.091 g, DyN 0.445 g, sufficiently mixing these raw materials in the protective atmosphere, pouring them into the molybdenum crucible, and rapidly migrating them into the tubular furnace, and then increasing temperature gradually to 1200° C. under the protection of highly pure nitrogen gas, maintaining the temperature for 3 h, and then raising the temperature till 1550° C., maintaining the temperature for 10 h, sifting after grinding, and washing till the conductivity being 4.68 μs/cm, and

TABLE 3

| | Chemical formula | Emission peak | x | y | Luminous intensity |
|---|---|---|---|---|---|
| Embodiment 5 | $Ca_{0.85}Y_{0.04}Al_{0.97}P_{0.03}SiN_{2.87}$:0.07Eu, 0.03Dy,0.01Tm | 656 | 0.6772 | 0.3239 | 133 |
| Embodiment 6 | $Ca_{0.84}Y_{0.04}Al_{0.97}P_{0.03}SiN_{2.86}$:0.07Eu, 0.03Dy,0.02Er | 655 | 0.6769 | 0.3241 | 128 |
| Embodiment 7 | $Ca_{0.84}Y_{0.04}Al_{0.97}P_{0.03}SiN_{2.86}$:0.07Eu, 0.03Dy,0.01Tm,0.01Lu | 657 | 0.6775 | 0.3236 | 138 |
| Comparative Embodiment 3 | $Ca_{0.93}AlSiN_{2.95}$:0.07Eu | 656 | 0.6770 | 0.3241 | 100 | finally drying under the temperature of 110° C., thereby obtaining the phosphor of $Ca_{0.8}Ba_{0.06}Y_{0.02}Al_{0.98}P_{0.02}SiN_3$: 0.1Eu,0.02Dy. Its luminous intensity is specified in Table 4, which is higher than the Comparative Embodiment 4.

Comparative Embodiment 4

Weighing $Ca_3N_2$ 5.474 g, $Sr_3N_2$ 0.767 g, $Si_3N_4$ 6.166 g, AlN 5.405 g, EuN 2.189 g, sufficiently mixing these raw materials in the protective atmosphere, pouring them into the molybdenum crucible, and rapidly migrating them into the tubular furnace, and then increasing temperature gradually to 1200° C. under the protection of highly pure nitrogen gas, maintaining the temperature for 3 h, and then raising the temperature till 1550° C., maintaining the temperature for 10 h, sifting after grinding, and washing till the conductivity being 4.68 μs/cm, and finally drying under the temperature of 110° C., thereby obtaining the phosphor power of $Ca_{0.84}Sr_{0.06}AlSiN_3$:0.1Eu. Its luminous intensity is specified in Table 4, which is lower than each Embodiment.

TABLE 4

|  | Chemical formula | Emission peak | x | y | Luminous intensity |
|---|---|---|---|---|---|
| Embodiment 8 | $Ca_{0.83}Na_{0.03}Y_{0.02}Al_{0.98}P_{0.02}SiN_3$:0.1Eu,0.02Dy | 665 | 0.6921 | 0.3076 | 125 |
| Embodiment 9 | $Ca_{0.83}Li_{0.03}Y_{0.02}Al_{0.98}P_{0.02}SiN_3$:0.1Eu,0.02Dy | 666 | 0.6923 | 0.3072 | 120 |
| Embodiment 10 | $Ca_{0.8}Sr_{0.06}Y_{0.02}Al_{0.98}P_{0.02}SiN_3$:0.1Eu,0.02Dy | 661 | 0.6906 | 0.3091 | 131 |
| Embodiment 11 | $Ca_{0.8}Ba_{0.06}Y_{0.02}Al_{0.98}P_{0.02}SiN_3$:0.1Eu,0.02Dy | 659 | 0.6901 | 0.3095 | 136 |
| Comparative Embodiment 4 | $Ca_{0.84}Sr_{0.06}AlSiN_3$:0.1Eu | 663 | 0.6912 | 0.3084 | 100 |

Embodiments 12-21 and the corresponding Comparative Embodiment are specified in Table 5, where their luminous intensities are all higher than the corresponding Comparative Embodiment. The method of manufacturing these Embodiments is identical to Comparative Embodiment 4.

TABLE 5

|  | Chemical formula | Emission peak | x | y | Luminous intensity |
|---|---|---|---|---|---|
| Embodiment 12 | $Ca_{0.8}Y_{0.1}Al_{0.9}P_{0.03}SiN_3$:0.01Eu,0.02Dy,0.03Tm,0.04Er | 636 | 0.6443 | 0.3547 | 134 |
| Embodiment 13 | $Ca_{0.76}Y_{0.18}Al_{1.09}P_{0.09}SiN_3$:0.01Eu,0.02Dy,0.03Tm | 639 | 0.6451 | 0.3535 | 131 |
| Embodiment 14 | $Ca_{0.75}Sr_{0.1}Li_{0.08}Y_{0.01}Al_{0.85}P_{0.02}SiN_3$:0.01Eu,0.05Dy | 638 | 0.6449 | 0.3538 | 138 |
| Embodiment 15 | $Ca_{0.71}Ba_{0.1}Na_{0.1}Y_{0.01}Al_{1.1}P_{0.07}SiN_3$:0.01Eu,0.03Dy,0.04Er | 638 | 0.6447 | 0.3540 | 142 |
| Embodiment 16 | $Ca_{0.79}Y_{0.1}Al_{1.08}B_{0.1}P_{0.08}Si_{0.9}V_{0.1}N_3$:0.01Eu,0.1Dy | 639 | 0.6450 | 0.3537 | 139 |
| Comparative Embodiment 5 | $Ca_{0.89}Ba_{0.1}AlSiN_3$:0.01Eu | 636 | 0.6441 | 0.3549 | 100 |
| Embodiment 17 | $Ca_{0.71}Y_{0.08}Al_{0.97}P_{0.03}Si_{1.1}Nb_{0.1}N_3$:0.18Eu,0.01Dy,0.02Tm | 676 | 0.7028 | 0.2970 | 135 |
| Embodiment 18 | $Ca_{0.735}Y_{0.06}Sc_{0.02}Al_{0.91}Ga_{0.06}P_{0.03}Si_{0.8}N_3$:0.18Eu,0.005Dy | 677 | 0.7030 | 0.2971 | 139 |
| Embodiment 19 | $Ca_{0.71}Li_{0.03}Y_{0.02}Al_{0.9}B_{0.03}Ga_{0.04}P_{0.03}SiN_3$:0.18Eu,0.06Dy | 677 | 0.7031 | 0.2969 | 136 |
| Embodiment 20 | $Ca_{0.71}Sr_{0.05}Y_{0.01}Al_{0.92}P_{0.08}Si_{0.95}N_3$:0.18Eu,0.02Dy,0.03Lu | 672 | 0.7011 | 0.2988 | 133 |
| Embodiment 21 | $Ca_{0.71}Sr_{0.05}Na_{0.01}Y_{0.01}Al_{0.95}P_{0.05}Si_{1.35}N_3$:0.18Eu,0.04Dy | 673 | 0.7014 | 0.2986 | 138 |
| Comparative Embodiment 6 | $Ca_{0.82}AlSiN_3$:0.18Eu | 675 | 0.7025 | 0.2973 | 100 |

What is claimed is:

1. A white-light LED red phosphor, characterized by the following chemical structural formula:

$$Ca_{1-y-m-e-r}Y_yM_mX_{x-p}P_pZ_zN_n:Eu_e,R_r \quad (1)$$

wherein, $0.001 \leq y \leq 0.2$, $0.001 \leq m \leq 0.2$, $0.5 \leq x$, $z \leq 1.5$, $0.001 \leq p \leq 0.1$, $2 \leq n \leq 4$, $0.001 \leq e \leq 0.2$, $0.001 \leq r \leq 0.1$, M is selected from at least one of Sr, Ba, Sc, Li, Na and K; X is selected from at least one of B, Al and Ga, wherein Al is must; Z is selected from Si, V and Nb, wherein Si is must; R is selected from at least one of Dy, Er, Tm and Lu, wherein Dy is must.

2. A method of manufacturing a white-light LED red phosphor according to claim 1, comprising steps of:

1) weighing required raw materials from nitrides of Ca, Sr, Ba, Li, Na and K, and nitrides or oxides of Y, Sc, B, Al, Ga, P, Si, V, Nb, Eu, Dy, Er, Tm and Lu according to chemical formula components in the structural formula (1) and stoichiometric ratio;

2) sufficiently mixing these raw materials in argon, nitrogen or nitrogen-argon mixing atmosphere;

3) performing segmented roasting to these mixed materials in a tubular furnace with a protective atmosphere adopting a normal-pressure high-temperature solid-state method; and
4) then going through post-processing, thereby making a white-light LED red phosphor.

3. The method of manufacturing according to claim 2, characterized in that in step 1), the Eu dosage is 0.1%-20% of the synthetic material mol, and the dosage of R is 0.1%-10% of the synthetic material mol.

4. The method of manufacturing according to claim 2, characterized in that in step 2), the contents of $O_2$ and $H_2O$ in the nitrogen, argon, or nitrogen-argon mixing atmosphere are 0.1-50 ppm.

5. The method of manufacturing according to claim 2, characterized in that in step 3), the protective atmosphere is pure nitrogen atmosphere, nitrogen-hydrogen mixing atmosphere or pure hydrogen atmosphere, and the atmosphere pressure is normal pressure.

6. The method of manufacturing according to claim 2, characterized in that in step 3), wherein the temperature of the first segmented roasting is 700-1200° C., with the roasting time being 2-6 h; the temperature of the second segmented roasting is 1400-1800° C., with the roasting time being 6-18 h.

7. The method of manufacturing according to claim 2, characterized in that in step 4), the post-processing procedures comprise: grinding, sifting, washing, and drying, where sifting is performed after grinding, washing is performed till a conductivity being less than 20 μs/cm, and finally drying is performed to obtain a finished product.

\* \* \* \* \*